(12) United States Patent
Budman et al.

(10) Patent No.: US 6,565,367 B2
(45) Date of Patent: May 20, 2003

(54) ZERO INSERTION FORCE COMPLIANT PIN CONTACT AND ASSEMBLY

(75) Inventors: Mark Budman, Vestal, NY (US); Bruce Chamberlin, Vestal, NY (US); Li Li, Plano, TX (US); James Stack, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/764,466

(22) Filed: Jan. 17, 2001

(65) Prior Publication Data

US 2002/0094708 A1 Jul. 18, 2002

(51) Int. Cl.7 ............................................... H01R 12/00
(52) U.S. Cl. .................... 439/82; 439/161; 439/479; 439/567
(58) Field of Search ..................... 439/84, 161, 82, 439/66, 78, 81, 932, 816; 411/479, 567

(56) References Cited

U.S. PATENT DOCUMENTS

| | | | |
|---|---|---|---|
| 3,569,901 A | * | 3/1971 | Connor ..................... 24/455 |
| 3,913,444 A | * | 10/1975 | Otte ........................ 411/479 |
| 4,072,816 A | | 2/1978 | Gedney et al. |
| 4,082,394 A | | 4/1978 | Gedney et al. |
| 4,462,651 A | * | 7/1984 | McGaffigan ............... 439/161 |
| 4,841,100 A | * | 6/1989 | Ignasiak ................ 174/138 G |
| 4,906,198 A | | 3/1990 | Cosimano et al. |
| 4,912,772 A | | 3/1990 | Beaudry, Jr. et al. |
| 5,064,063 A | | 11/1991 | Manca et al. |
| 5,129,830 A | | 7/1992 | Krajewski et al. |
| 5,139,890 A | | 8/1992 | Cowie et al. |
| 5,147,227 A | | 9/1992 | Yurko |
| 5,230,632 A | | 7/1993 | Baumberger et al. |
| 5,536,126 A | * | 7/1996 | Gross ........................ 411/411 |
| 5,653,601 A | | 8/1997 | Martucci et al. |
| 5,715,595 A | | 2/1998 | Kman et al. |
| 5,754,410 A | | 5/1998 | Bardsley et al. |
| 5,878,483 A | | 3/1999 | Kman et al. |

OTHER PUBLICATIONS

IBM Technical Disclosure Bulletin vol. 30, No. 11, 04/88, "Zero Insertion Force Female Test Head Connector".

* cited by examiner

Primary Examiner—Gary Paumen
Assistant Examiner—James R. Harvey
(74) Attorney, Agent, or Firm—Lawrence R. Fraley

(57) ABSTRACT

A compliant pin contact and assembly utilizing same in which the contact is comprised of two layers, each of a different material and coefficient of thermal expansion (CTE) than the other, to enable insertion within an opening in either a "cold" or "hot" state to thereby expand and positively engage the opening's walls, thereby securely holding the pin in position. Representative materials include Invar and aluminum.

3 Claims, 3 Drawing Sheets

ZERO INSERTION FORCE COMPLIANT PIN CONTACT AND ASSEMBLY

TECHNICAL FIELD

This invention relates to electrical connectors and to electronic structures using such connectors. More specifically, the invention relates to the use of compliant pin-type contacts adapted for being securely positioned within an opening, e.g., a plated through hole (PTH), in an electronic structure such as a printed circuit board (PCB) to provide electrical connection between the structure's circuitry and an external component, e.g., a pinned module.

BACKGROUND OF THE INVENTION

Various forms of pin-type electrical contacts, including those of the compliant type designed for being inserted within various electrical structures such as PCBs and test heads are known in the art, with examples shown and described in the following publications.

In U.S. Pat. No. 5,129,830 (Krajewski et al), there is described a "z-axis" connector pin designed to interconnect a plurality of stacked PCBs, the connector being drawn through aligned openings in the PCBs and frictionally engaging the internal walls of such openings.

In U.S. Pat. No. 5,139,890 (Cowie et al), there is described an electrical "component" such as a contact or relay in which the structure comprises a copper or copper alloy substrate having thereon a "thick" silver coating for resistance to oxidation and wear. A thin gold coating may also be added to further improve oxidation resistance, lubricity and to serve as a diffusion barrier.

In U.S. Pat. No. 5,147,227 (Yurko), a terminal pin is described for insertion within a plastic housing, the pin including two sets of outwardly projecting nibs each having a flat edge surface normal to the terminal's axis so as to dig into the plastic material and secure the pin in position.

In U.S. Pat. No. 5,230,632 (Baumberger et al), there is defined an electrical contact and connector wherein the contact is comprised of a first, highly conductive element and a second, internal spring element secured along a common interface to the first element. The second element has a greater modulus of elasticity than that of the first element. Projecting ends of the first element expand vertically in opposing directions to interconnect external conductors, e.g., PCB contact pads. This patent is assigned to the same assignee as the present invention.

In U.S. Pat. No. 5,653,601 (Martucci et al), a two-part connector structure is described wherein one contact part is deemed a receptacle for the other contact part, called the terminal socket. The receptacle fits securely within a base opening while the terminal thereafter inserts within the receptacle's central opening. The resulting connector is specifically designed for preventing solder wicking from conductor pads on the base.

In International Business Machine's Technical Disclosure Bulletin (TDB) vol. 30, no. 11, April 1988 (Frutchey), there is described and illustrated a zero insertion force contact in which spaced bimetal strips located within a test head are designed for expanding and contracting to receive a pin inserted between the two.

As understood from the following, it is a significant object of this invention to provide a relatively small electrical contact designed for relatively easy insertion within a corresponding electronic component opening without adversely altering the internal walls of such an opening. Being relatively small ensures that a plurality of such contacts can be utilized in a high density format, which is so much desired in today's electrical component field. It is believed that such a contact and associated structure which overcomes various problems associated with prior art connectors/contacts, such as severe opening wall deformation, insufficient frictional force application (to assure positive securement), increased insertion forces (especially when seating a large number of closely positioned contacts), etc. would constitute a significant advancement in the art.

OBJECTS AND SUMMARY OF THE INVENTION

It is a primary object of the present invention to enhance the art of electrical connectors and particularly the art of connectors which use contacts of the compliant type designed for being securely positioned within openings such as those in PCBs.

It is another object of the invention to provide a connector contact of the above type which can be readily positioned within a plurality of such PCB openings with no (zero) insertion force needed.

It is yet another object of the invention to provide such a zero insertion force connector contact which can be so positioned in a relatively dense array while assuring positive electrical connections to the various conductors associated with the PCB and external component.

In accordance with one aspect of the invention, there is provided an electrical contact comprising a first layer of material having a first coefficient of thermal expansion, and a second layer of material bonded to the first layer of material along a common interface and having a second coefficient of thermal expansion different than the first coefficient of thermal expansion. The contact includes a first outer diameter at a first temperature less than the first inner diameter of an opening located in a circuitized substrate in which the contact is adapted for being positioned and is expandable to at least the first inner diameter at a second temperature different than the first temperature when the contact is positioned within the opening so as to engage the wall of the opening to provide a secure fit within the opening of the circuitized substrate.

In accordance with another aspect of the invention, there is provided a circuit assembly comprising a circuitized substrate having an opening therein of a first inner diameter, an electrical component including a housing and at least one electrical contact projecting from the housing and adapted for being securedly positioned within the opening, the electrical contact including a first layer of material having a first coefficient of thermal expansion and a second layer of material bonded to the first layer of material along a common interface and having a second coefficient of thermal expansion different than the first coefficient of thermal expansion. The contact includes a first outer diameter at a first temperature less than the first inner diameter in the circuitized substrate and is expandable to at least the first inner diameter at a second temperature different than the first temperature when the contact is positioned within the opening so as to engage the wall of the opening to provide a secure fit within the opening of the circuitized substrate.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

Figures 1, 2:
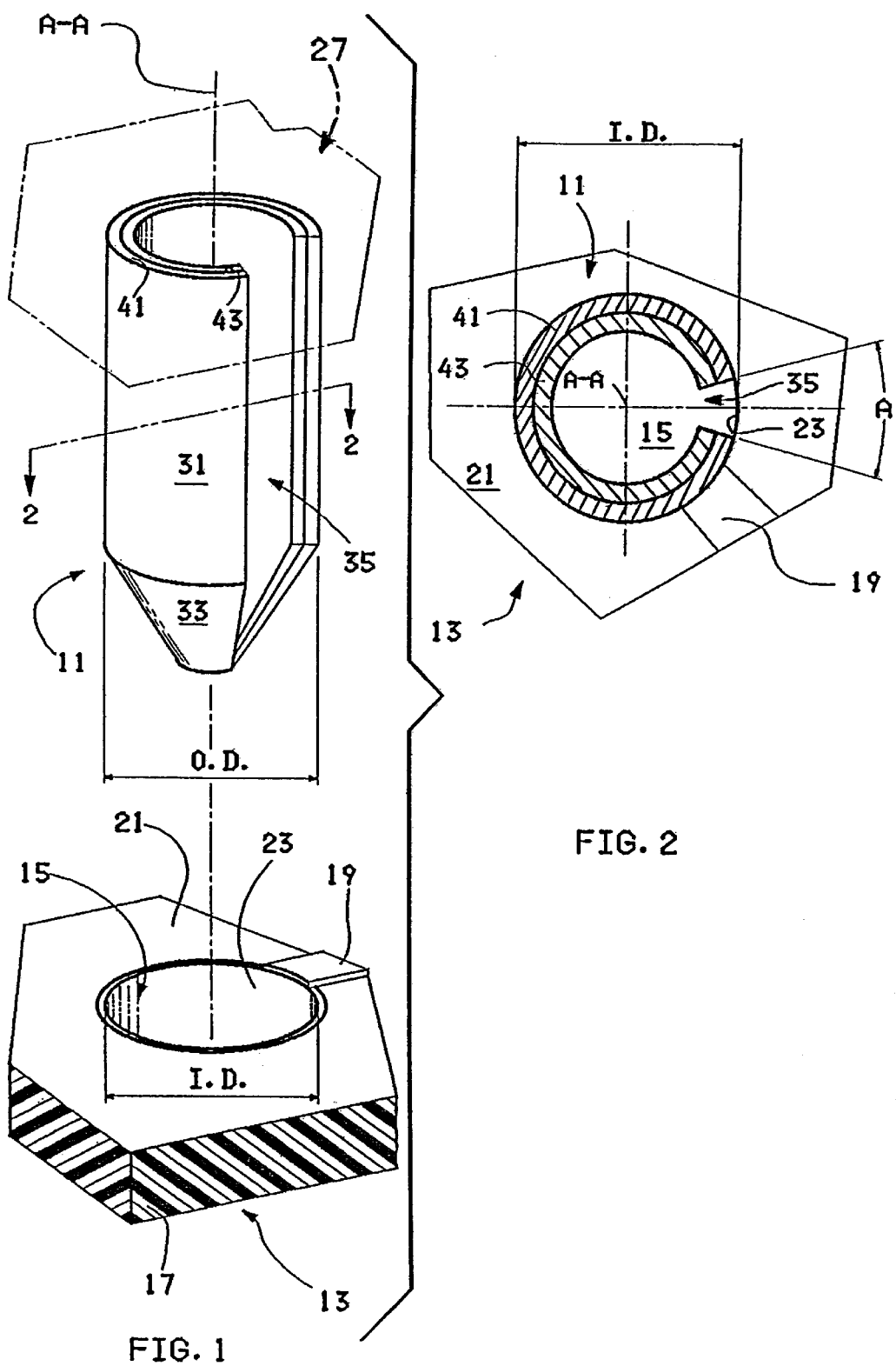
FIG. 1 is a much enlarged perspective view of the compliant pin contact of the present invention in accordance with one embodiment thereof, the contact shown as being aligned for positioning within an opening of a circuitized substrate.
FIG. 2 is a plan view, in section, taken along the line 2—2 in FIG. 1.

In FIG. 1, there is shown an electrical contact 11 in accordance with one embodiment of the invention, contact 11 shown elevated above a circuitized substrate 13 such as a typical printed circuit board (PCB) having at least one opening 15, e.g., a plated through hole (PTH), therein. Although only one contact 11 and associated opening 15 are depicted in FIG. 1, it is understood that in a preferred embodiment several paired contact-opening combinations are used.

In one specific example, a total of about 24 to about 2000 contacts 11 may be positioned in a corresponding number of openings in substrate 13. Such contacts may be positioned adjacent one another as closely as only about 0.08 inch, thus providing a highly dense contact pattern sought by today's electrical component designers and manufacturers.

Substrate 13 may be a typical PCB comprised of a suitable dielectric material 17 (e.g., from glass-filled polymer resin) having a plurality of internal layered conductive (e.g., copper) layers (not shown) designed for providing power, voltage and signal capabilities as needed. In FIG. 1, substrate 13 is shown to include a representative circuit layer 19 on the substrate's upper surface 21, the circuit layer being electrically coupled to the internal conductive layer 23 within opening 15. It is understood that layer 19 is not essential to the operation of the invention, as the invention's contact 11 may be electrically connected to one or more of the aforementioned internal conductive layers in substrate 13. It should also be understood that opening 15 does not need to include an internally conductive layer 23 extending the entire depth of opening 15, but instead may include no conductive material of this type, with contact 11 being electrically connected to selected ones of the described internal conductive layers which include portions thereof exposed with the opening.

In one example, contact 11 may be one of a plurality of such members all of which are part of a larger electronic component 27 (only partly shown in phantom in FIG. 1) designed for being mounted within/upon substrate 13. Various examples of such components are well known in the art and include electronic pinned modules such as defined in U.S. Pat. Nos. 4,072,816 (Gedney et al), 4,082,394 (Gedney), 4,912,772 (Beaudry et al), 5,064,063 (Mayran et al) and 5,754,410 (Bardsley et al), all of which are assigned to the same assignee as the present invention. All of these patents are incorporated herein by reference. As fully described in these cited patents, such a component typically includes a dielectric (e.g., plastic or ceramic) housing with the desired number of pin contacts projecting from a bottom surface thereof. The pins, typically copper, are adapted for being inserted within a corresponding pattern of openings in a designed receiving substrate, again, typically a PCB. Further description is thus not believed necessary.

Although the above pin type contacts have been described as part of an electronic module or the like component, the invention is not limited thereto. For example, it is possible in the broadest aspects of the invention to use one or more pin contacts of the invention as simply interconnects between two spaced PCBs or the like, as described in U.S. Pat. Nos. 4,906,198 (Cosimano et al), 5,715,595 (Kman et al) and 5,878,483 (Kman et al). These patents are also assigned to the same assignee as the present invention and are incorporated herein by reference.

In one example, opening can be the mentioned PTH which extends entirely through the substrate body, or, alternatively, it can be what is referred to in the art as a "via", which only extends a predetermined distance within the substrate from one of its outer surfaces. Such openings may include an inner diameter (ID, FIGS. 1 and 2) of from about 0.035 inch to about 0.045 inch, a representative example being 0.040 inch.

In a preferred embodiment of the invention, contact 11 includes a substantially cylindrical body portion 31 of a predetermined length (in one embodiment, a length of about 0.1 inch to about 0.2 inch is preferred) having projecting from an end thereof a tapered end portion 33. End portion 33, having a length of about 0.01 inch to about 0.02 inch (thus giving the contact an overall total length of only from about 0.09 inch to about 0.11 inch), is tapered to facilitate contact placement within opening 15, but may of course be of other configurations, including a cylindrical (round) extension of body portion 31. In one example, cylindrical body 31 possessed an outer diameter (OD, FIG. 1) of from about 0.02 inch to about 0.03 inch prior to opening insertion. As seen in FIGS. 1 and 2, contact 11 includes an open, slotted portion 35, which, as seen in FIG. 2, forms an acute angle (A, FIG. 2) of from about 20 degrees to about 40 degrees relative to the central axis (A—A) of contact 11. A preferred angle A is 30 degrees. Slotted portion 35 understandably allows contact body portion 31 to expand and contract as needed, subsequent and before contact insertion, respectively, the former thereby assuring a strong, frictional yet non-deforming type of engagement with the opening's internal wall(s).

As seen in FIG. 1, tapered end 33 and cylindrical body 31 are coaxial (along axis A—A) and slotted portion 35 extends substantially the entire length of end 33.

Expandable and contractible contact 11 is designed for being positioned during one of two states, which might be referred to as "hot" and "cold". Specifically, contact 11 is adapted for being contracted prior to opening placement and thereafter expanded to form the frictional engagement with substrate opening 15 once positioned therein. By the two states as mentioned above is meant that the contact, depending on layer material used, can be contracted to the above pre-insertion OD while in a heated or cooled environment and then positioned in the opening for eventual expansion at the operating temperature of the circuit assembly (component 27, substrate 13, etc.). Accordingly, contact 11 enters opening 15 in a non-engaging (or zero insertion force) manner, the resulting force needed to hold the contact in place being exerted only after said placement.

Figure 3:
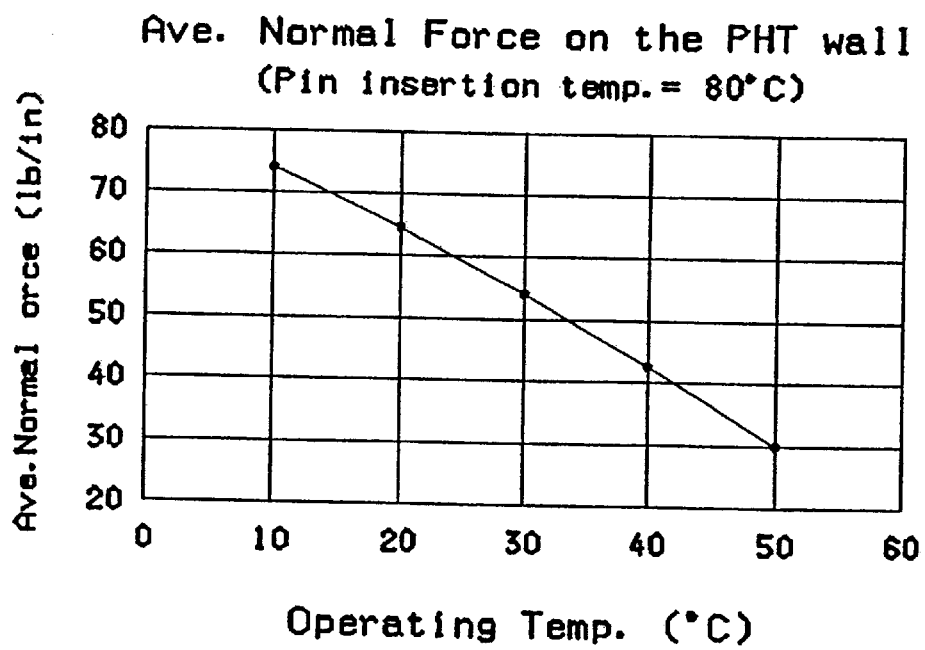
FIGS. 3 and 4 are charts showing the average normal forces exerted against an opening wall at two different pin contact insertion temperatures, one considered relatively high and the other relatively low.

To accomplish the above, contact 11 includes two different metal layers 41 and 43, each of a different coefficient of thermal expansion (CTE), bonded together along a common interface. In one embodiment, outer layer 41 may be aluminum while inner layer 43 may be Invar (a well known iron-nickel alloy that expands relatively little on heating). Each layer may include a thickness of from only about 0.003 inch to about 0.007 inch, a preferred thickness being 0.005 inch. In such an arrangement, contact 11 is designed for being inserted while at a relatively warm ("hot") temperature of from about 60 degrees Celsius (C) to about 100 degrees C., a preferred temperature being 80 degrees C. At this temperature, the contact outer diameter has a dimension within the foregoing range, which is less than the aforementioned internal diameter (ID, e.g., 0.040 inch) of the awaiting opening 15. Once inserted, and the operating temperature of module 27 and mating PCB is established (e.g., 20 degrees C.), the contact has fully expanded and exerts the predetermined normal force against the opening's internal wall(s). FIG. 3 is a chart showing the relative average normal force compared to various temperatures. At a relatively high temperature of about 50 degrees C., or about 30 degrees C.below the insertion temperature of 80 degrees C., contact 11 exerts a relatively small normal force of only about 30 lbs/in2 (PSI), but when the module-substrate assembly is at the normal room operating temperature (20 degrees C.), the contact exerts approximately 65 PSI of normal force against the opening's wall(s) to thus firmly hold the contact in position. Projecting the chart in FIG. 3 to an 80 degree C. operating temperature shows that the invention's contact will exert no normal forces, as expected, because the contact's outer diameter is much less than the corresponding internal diameter of the opening. Understandably, the contact will only exert force against the opening once it has begun its expansion and reaches the corresponding internal diameter (ID). The contact force continues to increase as the temperature decreases until the normal operating room temperature is attained.

Figure 4:
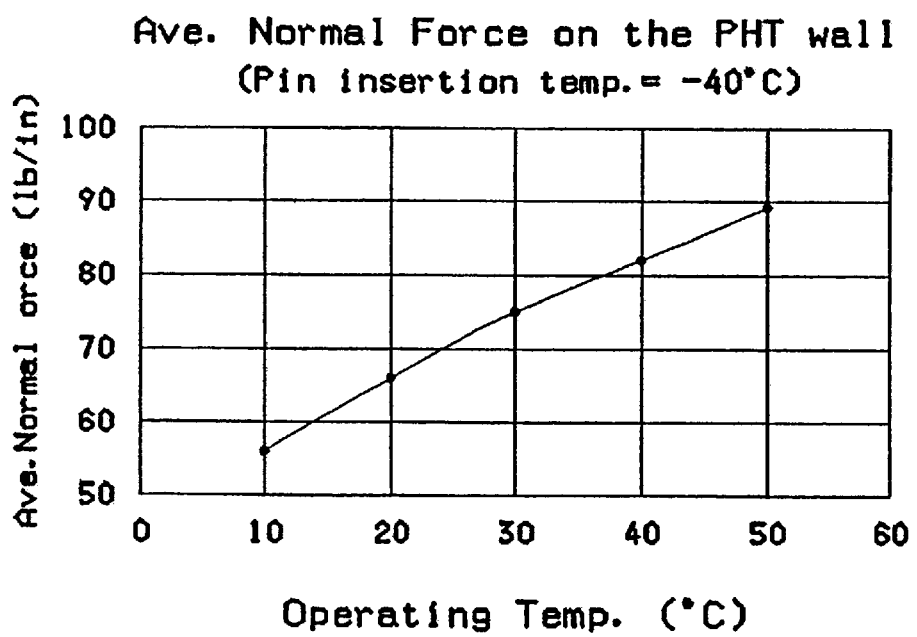

In FIG. 4, there is shown a chart which indicates normal force application for a contact of the invention in which the contact is inserted while in a "cold" state and thereafter allowed to expand outwardly as the operating temperature climbs. In this example, the outer layer 41 may be of Invar while the inner layer 43 is aluminum. The outer layer thus has a lower CTE than the corresponding inner layer, directly opposite to the aforementioned "hot" insertion embodiment described above. In FIG. 4, the contact is cooled to an extremely low temperature (e.g., −40 degrees C.) and then inserted within opening 15. As the contact warms up, gathering heat from the operating module-substrate assembly, it expands to exert a normal force of about 65 PSI against the opening's internal wall(s), or, about the same as the contact of FIG. 3. Should the operating temperature increase, as may occur in some working environments, the normal force increases proportionately, while, significantly, not deforming the opening's internal surfaces. In FIG. 4, for example, the contact exerts about 90 PSI on the opening at an elevated operating temperature of 50 degrees C. The "cold" insertion contact as mentioned in conjunction with FIG. 4, thus appears more suited for situations in which such a temperature increase may occur.

However, the "hot" insertion contact of FIG. 3 notably exerts a normal force of 30 PSI while at said 50 degrees C. operating temperature, sufficient to still effectively retain the contact in position.

In summary, the contact of the invention is adapted for being inserted within a substrate opening in which no forces are exerted against the opening wall(s) but for later expanding to engage the wall(s) and thereafter exert greater pressure if the temperature increases or decreases, depending on the unique material relationship of the outer and inner layers 41 and 43. As understood from the foregoing, only the outer layer of the contact's two layers physically engages the opening's wall(s). And such engagement is not sufficient enough to deform the plastic wall(s) material. Although a substantially C-shaped cross-sectional configuration is shown for contact 11, other configurations are possible, provided such configurations support contraction and expansion to the extent defined herein. Essentially, the cross-sectional configuration must be substantially round or the like (e.g., oval), in order to assure sufficient area contact with the opening. It is also possible for contact 11 to be of a substantially coiled configuration, similar to that of a coil spring, albeit flat in cross-section (to assure the contact's outer layer will only engage opening 15). Regardless of the configuration, contact 11 expands to exert its retention forces against the opening in a direction substantially k perpendicular (normal) to the contact's central axis (A—A). It is also possible in the invention to utilize metals other than Invar and aluminum for layers 41 and 43, with examples including combinations of Invar and brass, Invar and copper, and carbide and aluminum. It is also within the scope of the invention to use layers of different thicknesses, e.g., the outer layer thinner than the inner layer, depending of course on the metal used for each and the desired operating temperatures. As clearly seen in the drawings, and as readily understood from the foregoing definition (especially beginning at page 7, line 16), contact 11 includes only two layers, there being no third or additional layers shown or suggested.

While there have been shown and described what are at present the preferred embodiments of the invention, it will be obvious to those skilled in the art that various changes and modifications may be made therein without departing from the scope of the invention as defined by the appended claims.

What is claimed is:

1. An electrical contact adapted for being positioned within an opening of a circuitized substrate as defined by a wall within said substrate, said opening having an inner diameter, said contact comprising:

a first outer layer of material having a first coefficient of thermal expansion; and a second inner layer of material bonded to said first outer layer of material along a common interface and having a second coefficient of thermal expansion less than said first coefficient of thermal expansion, said first outer layer of said contact having an outer diameter at a first temperature less than said inner diameter of said opening located in said circuitized substrate in which said contact is adapted for being positioned and being expandable to said inner diameter of said opening at a second temperature less than said first temperature after said contact is positioned within said opening and said first outer layer engages said wall of said opening to provide a secure fit within said opening of said circuitized substrate, said electrical contact not including a third layer, said first and second layers forming coaxial cylindrical and tapered end portions and including a common slotted portion extending substantially the entire length of both portions.

2. The electrical contact of claim 1 wherein each of said first and second layers of material are comprised of metal.

3. The electrical contact of claim 2 wherein said first layer is aluminum and said second layer is Invar.

* * * * *